United States Patent
Huang et al.

(10) Patent No.: US 6,321,363 B1
(45) Date of Patent: Nov. 20, 2001

(54) INCREMENTAL SIMULATION USING PREVIOUS SIMULATION RESULTS AND KNOWLEDGE OF CHANGES TO SIMULATION MODEL TO ACHIEVE FAST SIMULATION TIME

(75) Inventors: Yen-Son Huang, Saratoga, CA (US); Martin Lu, HsinChu (TW); Chia-Huei Lee; Jensen Tsai, both of San Jose, CA (US)

(73) Assignees: Novas Software Inc., San Jose, CA (US); Springsoft Inc., Hsinchu (TW)

( * ) Notice: Subject to any disclaimer, the term of this patent is extended or adjusted under 35 U.S.C. 154(b) by 0 days.

(21) Appl. No.: 09/228,905

(22) Filed: Jan. 11, 1999

(51) Int. Cl.[7] .................................................. G06F 17/50
(52) U.S. Cl. ................... 716/4; 716/18; 703/16
(58) Field of Search ...................... 716/1–21; 703/14–16

(56) References Cited

U.S. PATENT DOCUMENTS

| | | | |
|---|---|---|---|
| 4,827,427 | 5/1989 | Hyduke | 703/14 |
| 5,051,938 * | 9/1991 | Hyduke | 703/15 |
| 5,111,413 * | 5/1992 | Lazansky et al. | 703/14 |
| 5,301,318 | 4/1994 | Mittal | 717/1 |
| 5,508,937 * | 4/1996 | Abato et al. | 716/6 |
| 5,761,079 * | 6/1998 | Drumm | 716/11 |
| 5,838,947 * | 11/1998 | Sarin | 703/14 |
| 5,867,399 * | 2/1999 | Rostoker et al. | 716/18 |
| 6,102,964 * | 8/2000 | Tse et al. | 716/18 |
| 6,134,705 * | 10/2000 | Pedersen et al. | 716/18 |

OTHER PUBLICATIONS

Ribas–Xirgo et al. ("On the reuse of symbolic simulation results for incremental equivalence verification of switch–level circuits", Proceedings of Design, Automation and Test in Europe, 1998 pp. 624–629), Feb. 1998.*

* cited by examiner

Primary Examiner—Matthew Smith
Assistant Examiner—Phallaka Kik
(74) Attorney, Agent, or Firm—Smith-Hill and Bedell

(57) ABSTRACT

Prior simulation results and model changes are used to shorten re-simulation time in improved design verification methodology, wherein simulator is re-run on design revision. Accelerated incremental simulation scheme boosts engineer design and verification productivity, and facilitates storage of different design revisions and simulation results.

6 Claims, 5 Drawing Sheets

INCREMENTAL SIMULATION USING PREVIOUS SIMULATION RESULTS AND KNOWLEDGE OF CHANGES TO SIMULATION MODEL TO ACHIEVE FAST SIMULATION TIME

FIELD OF INVENTION

Invention relates to computer-aided verification tools, particularly incremental simulation of electronic circuit designs.

BACKGROUND OF INVENTION

In electronic circuit design, engineers use may conventional logic simulator for design verification, such that when design problem is discovered during simulation, for example, engineers may seek to identify and correct certain circuit component or portion of subject design that causes such problem. Then, after design correction, revised design is often re-simulated. Depending design size and complexity, simulation time may vary significantly. Further, during chip-level or system integration phase, circuit design changes usually require re-simulation of entire chip or system, resulting in increased simulation time, which may detrimentally impact product delivery.

SUMMARY OF INVENTION

Invention resides in automated electronic design methodology and system for reducing re-simulation time, whereby previous simulation results and knowledge of changes made to design are used.

Accordingly, given simulation model V, for example, whereby prior simulation approach took X amount of time to run simulator to come up with simulation result R, then improvement is provided over prior approach, such that V becomes V', wherein improved re-simulation scheme operates using V, V', and R values, and new simulation result R' is thereby obtained in substantially shorter time than X, through effective usage of previous simulation result R and knowledge about difference between V and V'.

Furthermore, when integrated with hardware description language (HDL) debugger, such incremental or re-simulation scheme substantially improves engineer productivity, particularly at chip or system integration level design verification. Accordingly, different design versions and corresponding simulation results are more easily stored and managed.

DETAILED DESCRIPTION OF PREFERRED EMBODIMENT(S)

Preferred embodiment is implemented in electronic design automation (EDA) software, firmware, and/or associated hardware as well as system and/or circuit design and/or verification methodologies associated therewith. Hence, present improvement contemplates functional cooperation of novel design and/or verification software, for example, with conventional computing or processing equipment, such as computer-aided engineering design workstations and/or distributed network systems or multi-user combinations thereof.

In particular, preferred embodiment of such novel software includes one or more application programs and/or associated data files effectively to achieve improved system, logic, and/or circuit simulation performance, namely by reducing time to re-simulate thereof, whereby earlier or contemporaneous simulation results and/or knowledge of changes made to subject design are used therefor.

Figure 1:
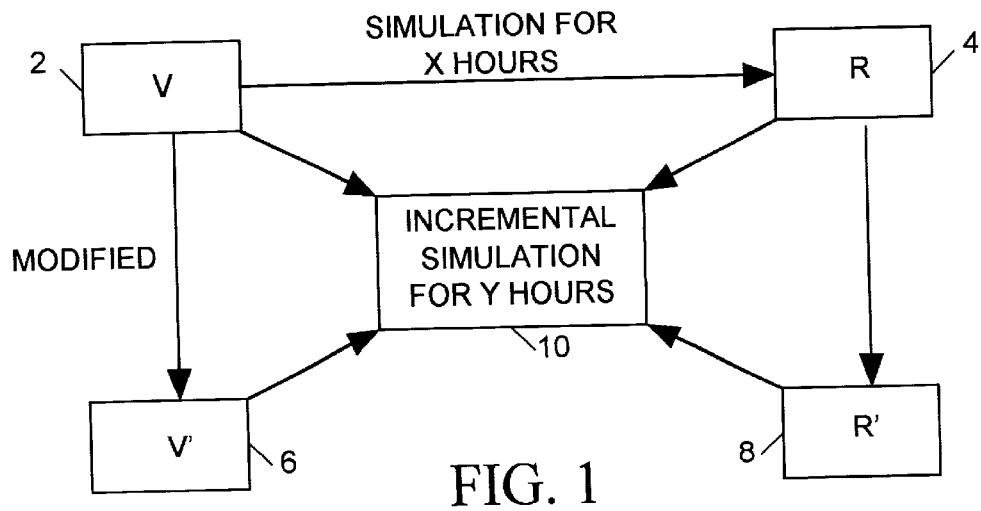
FIG. 1 is general diagram of inventive methodology.

Hence, as shown in FIG. 1, for example, when simulation model V 2 and prior simulation is accomplished in X time to complete simulation run, and thereby produce simulation result R 4, then substantial performance improvement is attained over prior approach. In this improved manner, V 2 becomes V' 6, wherein improved re-simulation scheme described herein operates using V 2, V' 6, and R 4 values; and new simulation result R' 8 is thereby obtained in substantially shorter time than X, preferably through effective usage of earlier and/or contemporaneous simulation result R as well as obtained knowledge about value difference between V 2 and V' 6.

Optionally, engineering productivity may be enhanced further by integrating hardware description language (HDL) debugger or other related EDA tool with incremental or re-simulation methodology described herein, especially when employed in chip or system integration level design and/or verification. Thus, various design versions and simulation results thereof may be stored and managed more efficiently and quickly.

In preferred embodiment described herein, logic simulation may be performed using digital logic or circuit simulator or functionally equivalent design verification application program, such as available commercially from Cadence Design Systems, Synopsys, etc., in cooperation with one or more simulation models having various parts, such as: input/output (I/O) ports, registers, combinatorial circuits, and/or testbench facility. I/O ports, or primary I/O ports, may be provided on chip boundary, having various input and output ports. Input ports are those connection points where signal values or other electronic stimuli may be applied, and output ports are those connection points where resultant signal values or other stimuli accordingly may be observed.

Also, registers are storage elements that can hold values independent of input, and do not change such values until certain events occur (e.g., clock arrival.) Combinatorial circuits include gates, such as logical AND/OR/NOT/etc., for performing Boolean or other related functions on ports and registers, for example. Further, such circuits may couple input ports and/or register outputs to output ports and/or register inputs. Moreover, so-called testbenches are used to generate test, control, data or other signal values as stimuli for application to various input ports.

Generally, therefore, simulator program operates initially by evaluating testbench to generate data log or list of time and/or other values applicable to certain input ports. When such values change or otherwise transition logically or electrically as inputs to combinatorial circuits, then such circuits are evaluated by simulator to determine new values as next-state or subsequent time slice output signals for current, next or other subsequent temporal cycle for simulation run. As appropriate, gate or other circuit delays may be applied thereto. Moreover, if register or other circuit-triggering event is detected, any value held by such triggered register or circuit may be updated appropriately, for example, by propagating input value or signal representative thereof. Again, as appropriate gate or other circuit delays may be applied on such registers or circuits.

Simulator operation continues execution over incremental time steps according to subject design simulation models and any input values applied thereto, until quiescent state or similar pause, halt, or other non-simulating condition is reached according to subject simulation model, or when user-specified or programmed condition, or simulation time or event is reached. During simulation run, simulator computes new signal values for each signal in combinatorial circuits, register outputs, and output ports. New values, as well as simulation times, are recorded in simulation result file or data log.

Figure 2A:
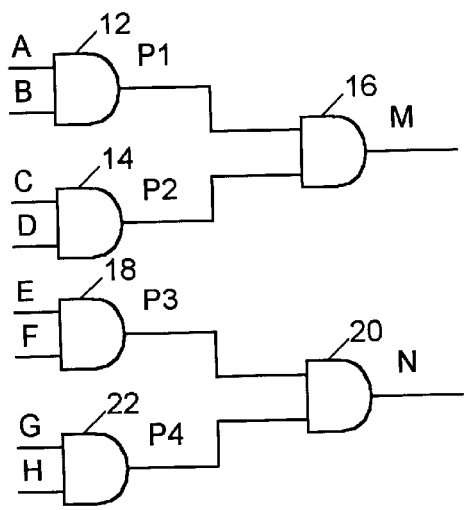
FIGS. 2A–B and 3A–B are sample logic diagrams to illustrate present invention.

FIG. 2A logic diagram of sample combinatorial circuit or simulation model thereof, including interconnected AND gates 12, 14, 16, 18, 20, 22 and various associated I/O ports, serves to illustrate incremental simulation aspect of present novel design and verification methodology and system. Here, digital test vectors or specified input signals may be applied to input ports A, B, C, D, E, F, G, H, for example, as input values (0, 0, 0, 0, 1, 1, 1, 1) at simulation time 1, as input values (1, 0, 1, 1, 1, 0, 0, 0) at simulation time 2, and input values (1, 1, 1, 1, 0, 0, 0, 0) at simulation time 3. Hence, such sample Boolean logic appropriately provides: M=0, N=1 at time 1, M=0, N=0 at time 2, and M=1, N=0 at time 3.

Figure 2B:
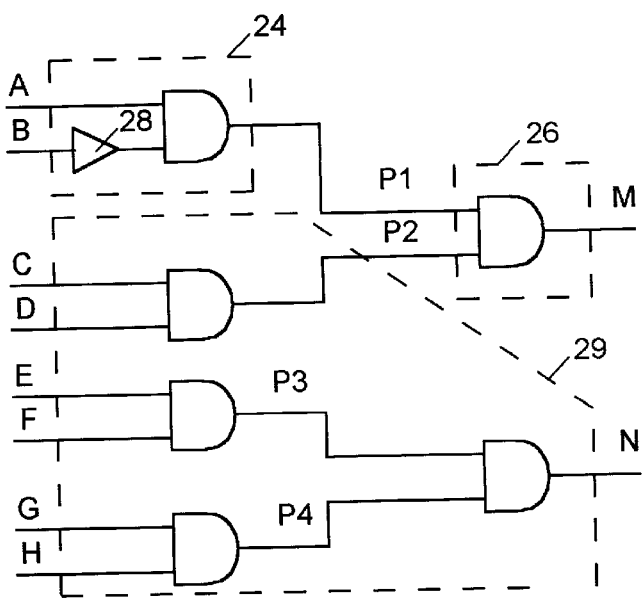

In FIG. 2B, above sample combinatorial circuit may be modified, whereby inverter 28 is added as shown to negate signal B prior to application to AND gate 12. Further, resimulation of such modified circuit design is run by present design verification system, particularly by applying same previous input test vectors.

Now, some parts or portions of newly configured combinatorial circuit, shown in FIG. 2B, may be mapped correspondingly to original unmodified circuit design, shown in FIG. 2A. In particular, signal values in such corresponding unmodified circuit part or portion also remain unchanged and specifically not re-simulated, i.e., during subsequent re-simulation of such modified circuit design. However, other parts or portions include circuit changes, and, thus, require re-simulation, preferably from beginning to end simulation times.

Furthermore, although some newly modified circuit parts or portions may be mapped to original circuits, some input signals applicable thereto are connected to one or more outputs of such circuits including such modified logic. In this case, such modified circuit portions are re-simulated for simulation cycles when values on certain signals differ from original simulation run.

Still referring to FIG. 2B, modified subject circuit design is shown with various apportionments (i.e., as described further herein, regular dotted line portion 29 encloses part of circuits of "invariant" case, thick dash-dotted line portion 24 encloses part of circuits of "variant" case, and thick dotted line portion 26 encloses part of circuits of "conditional" case).

Preferably, present novel incremental simulation methodology and system is accomplished using one or more signal values which interconnect such invariants, variants, and/or conditionals circuit portions, which are provided in simulation result or data log file. For example, representative values of P1 and P2 shown may be saved in simulation result file, and, further, by applying input test vectors to original circuit, then present simulation scheme initially produces: P1=0, P2=0 at simulation time 1; P1=0, P2=1 at simulation time 2; and P1=1, P2=1 at simulation time 3.

Then, to perform incremental simulation on newly-modified circuit of present example, P1 or other value may be re-computed for various applicable simulation times. For example, at simulation time 1, P1 is calculated as 0 value, which is same as original simulation run. Hence, at simulation time 1, conditionals are not evaluated. Next, at simulation time 2, P1 value is computed as 1, which differs from original run value. Thus, conditionals are evaluated appropriately, whereupon M value may be determined correspondingly to change from 0 to 1. Furthermore, simulation time 3 computed value for M is determined to change from 1 to 0.

Optionally, present methodology and system may apply incremental simulation as well to circuits containing register-type sequential circuits. In this case, any invariants circuit portions are considered independent of change; and, register-type circuits included therein do not matter for present purpose. Regarding any variants circuit portions, such portions, which may contain register-type circuits, are re-simulated from beginning to end simulation times.

Additionally, regarding any conditionals circuit portions, such portions may be refined further, particularly by dividing such portions into two sub-categories: i.e., pure-conditionals, and register-conditionals. So-called pure-conditionals are sub-circuits which may be extracted from original conditionals containing substantially all combinatorial circuits. And so-called register-conditionals are sub-circuits which may be extracted from original conditionals containing substantially all registers.

Preferably, because of foregoing refinement of various portions, incremental simulation scheme is performed such that values from signals interconnecting invariants, variants, and conditionals, as well as signals interconnecting pure-conditionals and register-conditionals are provided in simulation result file.

Figure 3A:
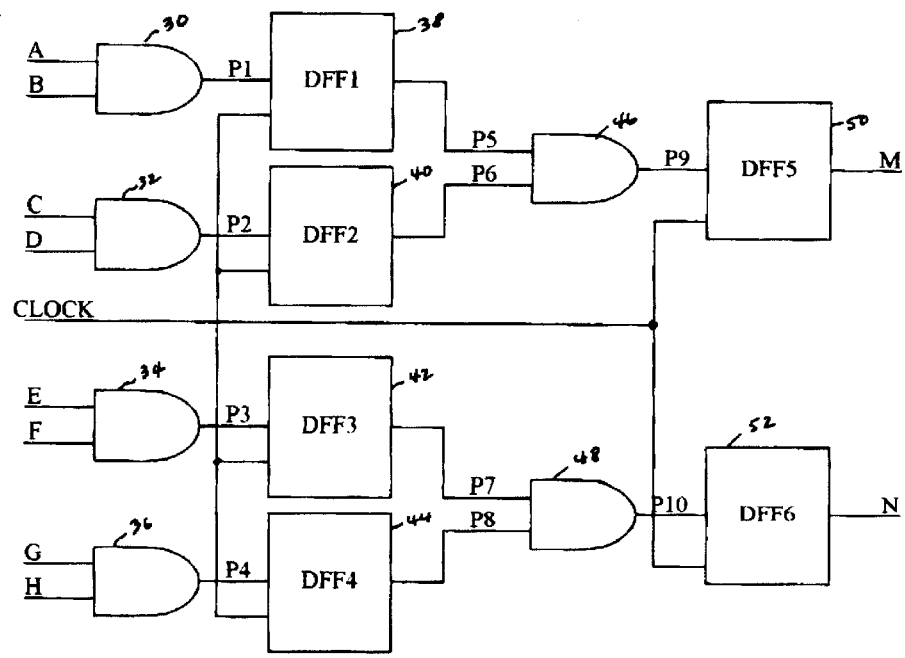

FIG. 3A logic diagram of another sample combinatorial circuit or simulation model thereof, including interconnected AND gates 30, 32, 34, 36, 46, 48, D-type flip-flops 38, 40, 42, 44, 50, 52 and various associated I/O ports, serves further to illustrate incremental simulation aspect of present novel design and verification methodology and system.

Figure 3B:
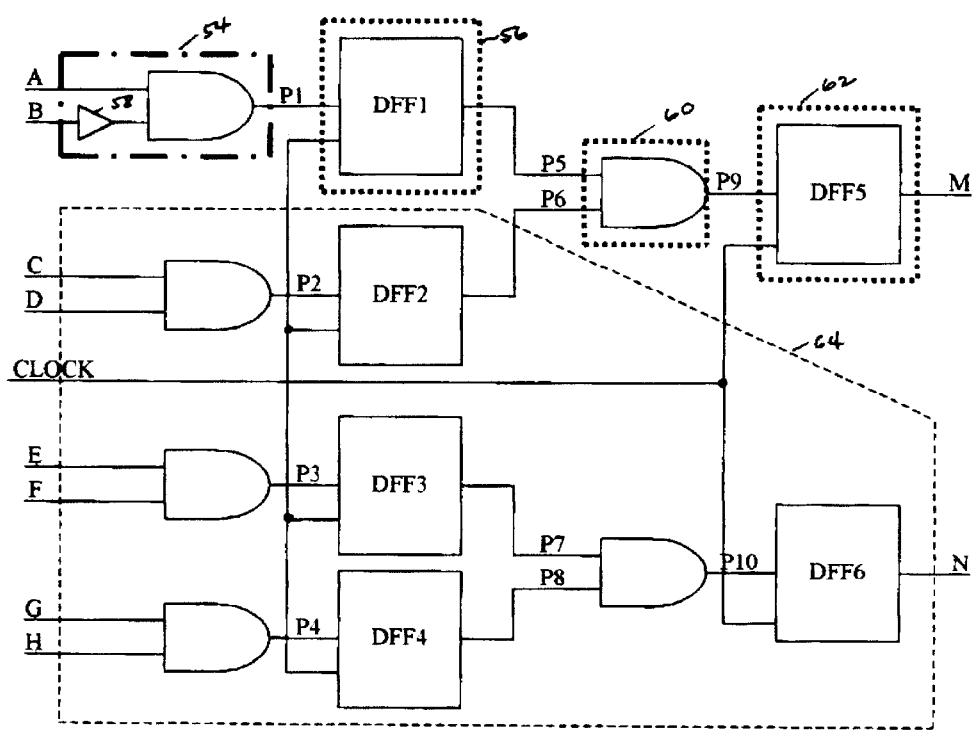

Here, incremental simulation is performed on circuits containing one or more register-type circuits, substantially as described herein. FIG. 3B logic diagram shows modified subject circuit design with various apportionments (i.e., as described further herein, regular dotted line portion 64 encloses part of circuits of "invariant" case, thick dash-dotted line portion 54 encloses part of circuits of "variant" case, including modification inverter 58, and thick dotted line portions 56, 60, 62 enclose part of circuits of "conditional" case).

Regarding invariants sub-circuit type, which are change-independent, and variants sub-circuit type, which are re-simulated entirely, such two sub-circuit types may handle simulation delay calculations. In addition, regarding pure-conditionals and register-conditionals sub-circuit types, following preferred approaches may be taken for handling simulation delay calculations:

Register-Conditionals:

To evaluate signal propagation and functionality through register-conditionals sub-circuit block, simulation event(s) are scheduled to be triggered or otherwise invoked after specified register delay has elapsed. Meanwhile, such register sub-circuit(s) may continues to hold unchanged value(s). Then, when such simulation event(s) occur, newly-computed values corresponding thereto are set on such register(s).

Pure-Conditionals:

To evaluate signal propagation and functionality through pure-conditionals sub-circuit block, in response to value changes of input signals, all sub-circuit block gates are processed or otherwise calculated for simulation at same time, while accounting for any delays on each gate. After such calculation pass, events may be scheduled for each output signal thereof. Time amounts scheduled for each event to fire up or otherwise invoked may be based on all delays aggregated collectively for particular paths.

If such simulation scheduling results in conflicting multiple events for same output signal, then such case may be resolved as follows:

1. If output signal delay is "transport" type, then such events are left unchanged as originally scheduled.
2. Otherwise, if such signal delay type is "inertial", then events triggered sooner may be canceled by events triggered at relatively later simulation time.

Optionally, present incremental re-simulation methodology and/or system may be applied as well at system and/or circuit designs specified at other higher or lower functional abstraction levels, such as register transfer level (RTL), behavioral, etc. Preferred scheme steps follow:

1. Deem each functional or behavioral block as "box" with input and output signals.
2. Identify blocks containing changes in new circuit; call such blocks variants.
3. Identify blocks mapped completely to original design, and inputs are independent of changes; call such blocks invariants.
4. Other blocks are conditionals. For conditionals blocks, identify those which contain "registers", then extract "registers" by dividing blocks into sub-blocks. When extraction done, then resulting sub-blocks deemed pure-conditionals and register-conditionals. Otherwise, consider such conditionals as variants.
5. After variants, invariants, pure-conditionals and register-conditionals blocks are decided, incremental re-simulation scheme described herein may be applied in same manner.

In particular, according to aspect of present invention, revised simulation model is appropriately mapped to original simulation model. For example, so-called VHDL-format high-level description model file may be used accordingly, thereby defining prototype design having hierarchically-organized architecture entities. Thus, entity architecture may include: signal declarations, including I/O ports, process blocks, component instantiations, and/or other related functional design entities.

More particularly, component instantiation represents "placement" of entity architecture. Through component instantiations, entity architectures may be placed inside or outside other entity architectures, thereby forming hierarchy tree structure. Component instantiations may also specify wiring of signals between placed entity architectures to containing entity architecture. Additionally, process block may specify sequential processing of circuit design blocks. Entity architecture may contain number of process blocks, and signals may be wired between process blocks.

Hence, when Verilog or VHDL-format design or model is revised according to preferred methodology and/or system, for example, particular changes may arise in signal declarations, process blocks, and/or component instantiations. In case of Verilog model format, simulation design modules are similarly organized hierarchically, and thereby correspondingly contain signal declarations with I/O ports, initial blocks, always blocks, and module instantiations. Preferably, incremental simulation is directed at relatively small or minor changes, relative to original design.

In accordance with present invention, various design changes or modifications are contemplated, such as: adding new signal, removing signal, modifying signal (e.g., by changing number of signal bits), adding new process block, removing process block, modifying process block, inserting new node in hierarchy (e.g., by adding component instantiation statement), removing node from hierarchy (e.g., by removing component instantiation statement), modifying wiring to node in hierarchy (e.g., by modifying component instantiation statement), renaming (e.g., signal, process block, entity, or architecture), etc.

Rename cases are appropriate when user can provides list of name mappings for corresponding conversion between revised and original names. In particular, when rename cases are excluded, other remaining cases in subject design may be categorized as: no change in hierarchy, and change in hierarchy.

In case of no change in hierarchy, specified signals, process blocks, and/or wiring may be added, deleted, and/or modified relative to specified instances, preferably without affecting hierarchy tree. Generally, nodes in hierarchy tree may be mapped in straightforward fashion from revised model to original model. Thus, for each node in given design hierarchy tree, changed process or instantiation blocks (i.e., variants) may be separated from unchanged blocks (i.e., invariants or conditionals).

Then, after such processing is done for each and every node, next step is to separate invariants from conditionals, preferably by tracing signals. Any unchanged block whose input is tied to variants or conditionals are then designated as conditionals, preferably in iterative manner until number of conditionals does not change. Furthermore, registers in process blocks in conditionals group are identified and separated into pure-conditionals, register-conditionals, or variants using procedure described herein.

In particular, for each type of node in design hierarchy or entity-architecture, following sets are defined accordingly:

$I_o$: Set of input ports not changed
$I_v$: Set of input ports new or changed
$B_o$ : Set of process/instantiation blocks not changed
$B_v$: Set of process/instantiation blocks new or changed Further, for each node in hierarchy or instance of entity-architecture, following sets are defined:

$II_o$: Set of input ports not changed
$II_v$: Set of input ports new or changed
$BB_o$: Set of process or instantiation blocks not changed
$BB_v$: Set of process or instantiation blocks new or changed, i.e., variants blocks
$II_c$: Set of input ports not changed, but during simulation, values may different from original run
$BB_c$: Set of process or instantiation blocks not changed, but during simulation, they may re-calculated from time to time, i.e., conditionals blocks
$BB_r$: Set of conditionals blocks contain internal registers or latches; "internal" registers and latches are those whose outputs are not outputs of containing block.

Furthermore, regarding case of no change in hierarchy, following preferred methodology is applied using foregoing defined sets:

1. Sort changed input ports and changed blocks in each entity-architecture. For each type of node in hierarchy tree, partition input ports, process blocks, and instantiation blocks into $I_o$, $I_v$, $B_o$, and $B_v$.

2. Initialize partitions on input ports and blocks for each instance in design hierarchy. For each node in hierarchy tree, make $II_o$ same as $I_o$, $II_v$ same as $I_v$, $BB_o$ same as $B_o$ and $BB_v$ same as $B_v$ from corresponding node type. Set $II_c$, $BB_c$ and $BB_r$ to empty.
3. Sort input ports on unchanged instances, but may have different values at various time comparing with original run. For each node in hierarchy tree, examine each member in $II_o$. If connected to member in $BB_v$ or $BB_c$, then move from $II_o$ to $II_c$.
4. Sort unchanged blocks, but inputs may have different values at various time comparing with original run. For each node in hierarchy tree, examine each member in $BB_o$. If connected to member in $BB_v$, $BB_c$ or $II_c$, then move from $BB_o$ to $BB_c$.
5. Repeat Step 3 and Step 4 until no more changes.
6. Sort conditionals blocks that contain internal registers or latches. For each node in hierarchy, examine each member in $BB_c$. If internal registers or latches are contained, then move to $BB_r$.
7. Decide if conditionals blocks that contain internal registers or latches should become variants blocks, or split into sub-blocks with each sub-block becoming variants or conditionals.

When computing variant or conditional blocks, input signal values may be determined for simulation thereof Although output values for variant blocks are readily available, other values may be more readily obtained from dump file, or if not present in dump file, then converted from block driving such signals to variant block.

Further, during incremental simulation, variant, invariant, and conditional blocks are treated differently. Invariant blocks are not re-computed, thereby effectively skipped for re-simulation. Variant blocks are re-computed, and, thus, scheduled for execution as in normal simulation scheme, (i.e., input signal changes, regardless of computed or copied results, trigger re-computation of such blocks.)

Preferably, condition blocks are provided in "compute" and "copy" modes. Conditional block is in compute mode when input signals have different values than in dump file, and copy mode when value change on input signals causes such values to be same as in dump file. Moreover, when conditional block is in copy mode, output signals values are obtained directly from dump file, and when conditional block is in compute mode, output signals are thereby calculated.

Input signals to conditional or variant block are sourced from variant blocks, invariant blocks, or conditional blocks. As specified herein, Iv represents input signals from variant blocks, Ii represent input signals from invariant blocks, and Ic represents input signals from conditional blocks.

During signal processing, conditional blocks initially are in copy mode (i.e., output signals of conditional blocks obtain initial values from dump file.) Conditional block is in copy mode until value change on Iv or Ic, and such value is different from dump file. Then, conditional block is switched to compute mode.

Preferably, when conditional block is in compute mode, output values are calculated when following occurs to cause Iv or Ic values to differ from dump file:
1. Variant block is executed, and value change arrives on signal in Iv;
2. Conditional block in compute mode is executed, and value change arrives on signal in Ic; or
3. Detected in dump file that value change occurs on signal in Ii, or Ic whose driving conditional block is in copy mode.

In addition, conditional block switches from compute mode to copy mode when following occurs, causing Iv and Ic values to be same as in dump file:
1. Variant block is executed, and value change arrives on signal in Iv, and value is same as in dump file; or
2. Conditional block in compute mode is executed, and value change arrives on signal in Ic, and value is same as in dump file.

Variant block processing is substantially similar to conditional block processing in compute mode, as described herein. But, variant blocks need not compare current input signal values with values in dump file. In particular, variant block may be executed when following occurs:
1. Variant block is executed, and value change arrives on signal in Iv;
2. Conditional block in compute mode is executed, and value change arrives on Ic signal; or
3. Detected in dump file that value change occurs on signal in Ii, or Ic whose driving conditional block is in copy mode.

For time-saving analysis described herein, following values are defined:

B: Number of blocks in model

S: Number of signals in model

T: Number of time units simulated f: Percentage of blocks fired per time unit $P_{block}$: Average processing time on executing block $P_{signalupdate}$: Average processing time on scheduling block for execution $P_{schedule}$: Average processing time on updating and propagating signal Hence, estimated total time for simulation follows:

$$B*f*(P_{block}+P_{schedule})*T+S*f*P_{signalupdate}*T$$

$B_v, B_i, B_c$: Number of blocks in variants, invariants, and conditionals (i.e., $B_v+B_i+B_c$ is close to B)

$S_v, S_i, S_c$: Number of signals in variants, invariants, and conditionals (i.e., $S_v+S_i+S_c$ is close to S)

T: Number of time units simulated f: Percentage of blocks fired per time unit $f_c$: Percentage of blocks in conditionals that need re-calculation per time unit $P_{block}$: Average processing time on executing block $P_{schedule}$: Average processing time on scheduling block for execution $P_{signalupdate}$: Average processing time on updating and propagating signal $P_{signalcompare}$: Average processing time on comparing signal to decide if different from previous run Accordingly, following calculations are provided:

$$B_v*f*(P_{block}+P_{schedule})*T*S_v f*P_{signalupdate}*T+B_c f*f_c*(P_{block}+P_{schedule})*T+S_c*f*f_c*P_{signalupdate}*T+S_c*f*P_{signalcompare}*T$$

Removing common factor f*T,

Original case: $B*(P_{block}+P_{schedule})+S*P_{signalupdate}$ vs.

Revised case: $(B_v+B_c*f_c)*(P_{block}+P_{schedule})+(S_v S_c*f_c)*P_{signalupdate}+S_c*P_{signalcompare}$ In worst-case scenario, fc is equal to 1 (i.e., every block in conditionals group is re-calculated.) So, revised calculation follows:

$$(B_v+B_c)*(P_{block}+P_{schedule})+(S_v+S_c)*P_{signalupdate}+S_c*P_{signalcompare}$$

Here, prefer to treating conditionals as variants, thereby removing last term, which is time to compare signal values.

Additionally, conditionals may be merged to variants, as follows:

$$(B_v+B_c)*(P_{block}+P_{schedule})+(S_v+S_c)*P_{signalupdate}$$

Thus, when conditionals are merged to variants, achieved simulation performance time depends on size of invariants, whereby the larger the invariants part, the bigger saving in time achieved.

Moreover, in best-case scenario, $f_c$ is close to 0 (i.e., blocks in conditionals group are rarely re-calculated.) Hence, revised calculation follows:

$$B_v*(P_{block}+P_{schedule})+S_v*P_{signalupdate}+S_c*P_{signalcompare}$$

Because variants sizes may be relatively small (i.e., assuming associated signals are dumped in original run), prior calculation may be dominated by $S_c*P_{signalcompare}$. Thus, in best-case scenario, dominating factor in determining time for incremental simulation is efficiency of comparing signals in conditionals with result from prior run.

Figure 4:
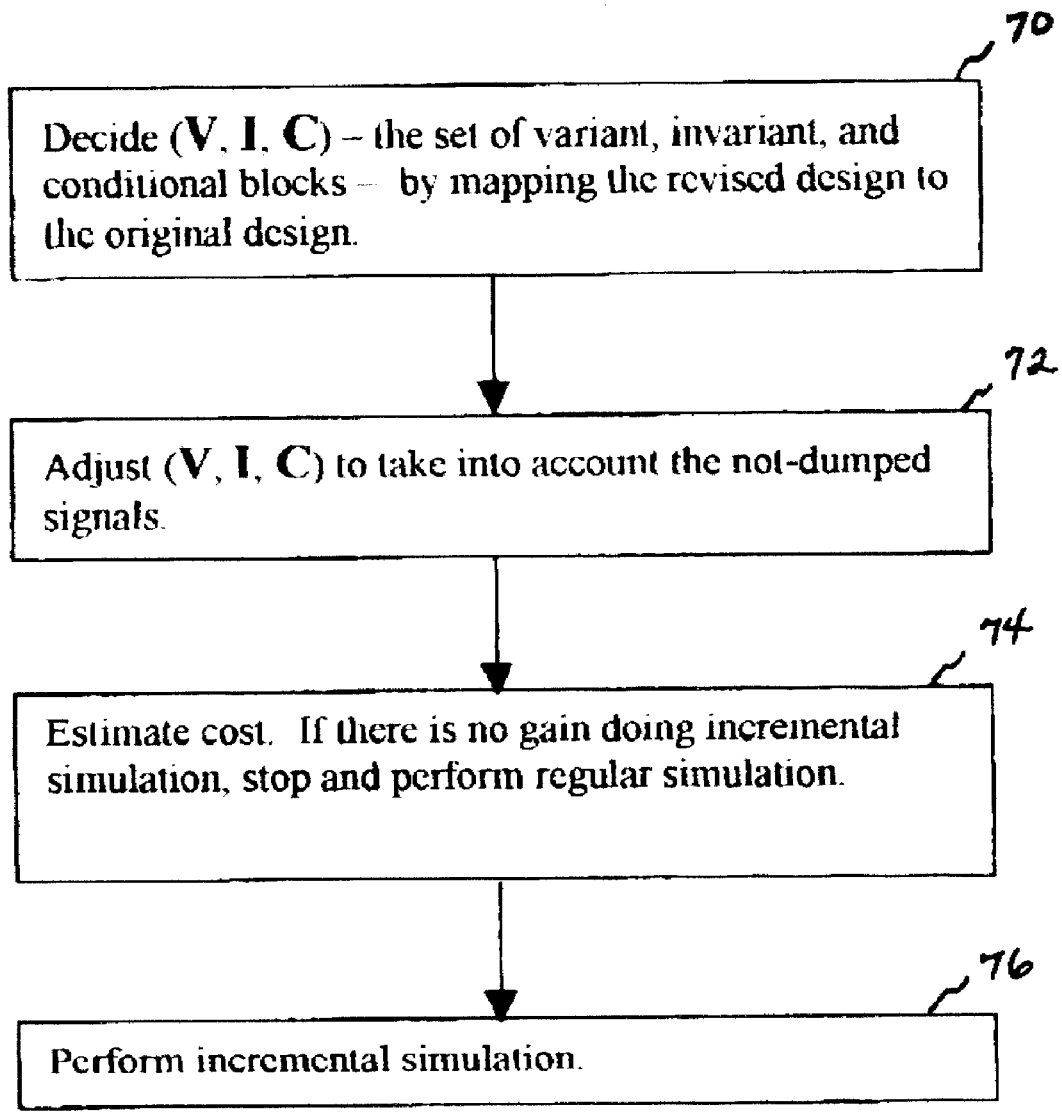
FIGS. 4 and 5A–B are flow charts of operational steps for implementing present invention.

FIG. 4 illustrates general operational steps of present inventive methodology and associated implementation system. Initially, system processor determines 70 sets of variant (V), invariant (I), and/or conditional (C) block states or representative instantiations, as applicable to subject circuit design blocks, preferably by automated mapping of revised design to original design.

Then, such V, I, and C determinations considered 72 by system processor along with signals which are not stored in dump file. Next, cost or other comparable design attribute is estimated 74, whereby if there is no advantage or gain for proceeding with incremental simulation, then halt and continue normal (i.e., non-incremental) simulation 76.

Figure 5A:
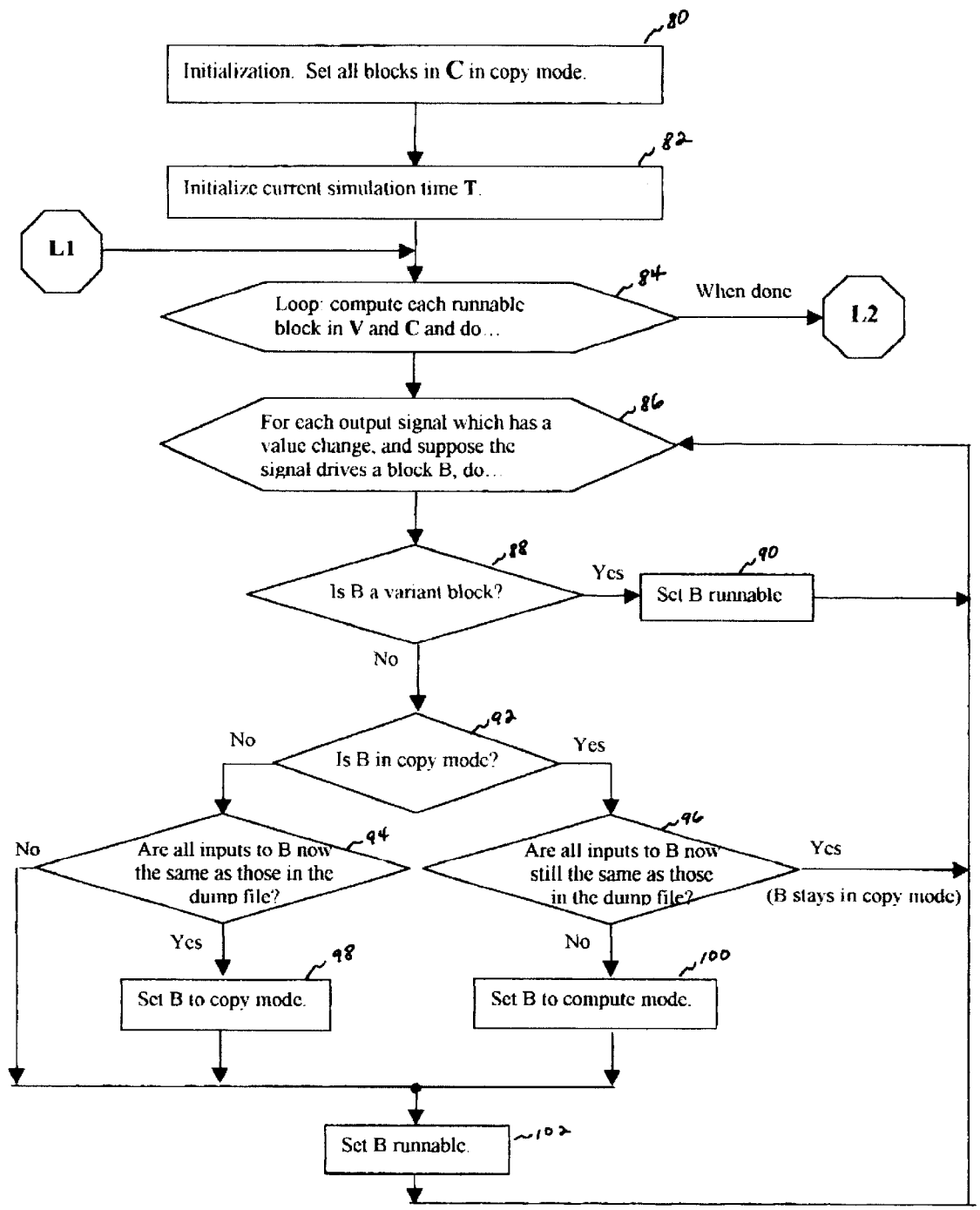
Figure 5B:
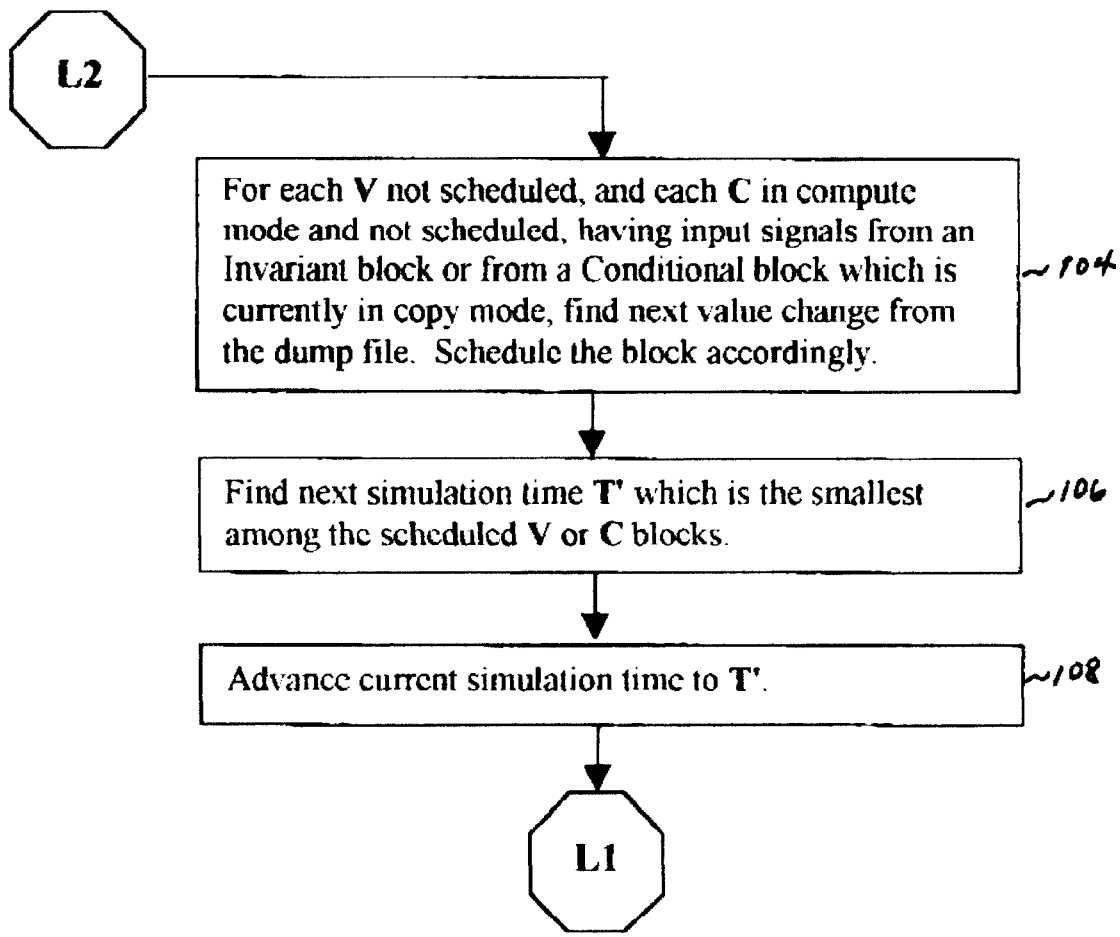

FIGS. 5A–B detailed flow chart further illustrate incremental simulation aspects of present invention, as implemented preferably by system processor as programmably configured per specification herein. Initially, subject design blocks are set 80 in C in copy mode, and current simulation time T is also set 82.

Feedback loop is provided 84 for computing steps shown for each runnable block in V and C, which transfers to steps 104, 106, 108 in FIG. 5B when done looping (L2). In particular, for each V not scheduled, and each C in compute mode, and not scheduled, having input signals from invariant block or from conditional block which is currently in copy mode, next value change is determined 104 from dump file, and block is scheduled accordingly. Next simulation time T', which is smallest among scheduled V or C blocks, is determined 106, then current simulation time T' is advanced 108, and return loop control (L2).

Moreover, for each output signal, which has value change, whereby such signal drives a block B, then perform 86 following steps. Determine 88 whether B is variant block; if so, then set 90 B as runnable. Otherwise, determine 92 whether B is in copy mode. If so, then determine whether all inputs to B are same as in dump file; if so, B stays in copy mode, and return to step 86, otherwise, set 100 B to compute mode. If B is determined not to be in copy mode, then determine 98 whether all input to B are same as in dump file; if so, then set 98 B to copy mode. Then, B is set 102 to be runnable, as shown, and return to step 86.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by claims following.

What is claimed is:

1. A method for designing and simulating a circuit comprising the steps of:

a. providing a first circuit model describing the circuit as a network of blocks, including blocks for receiving and processing input signals to produce output signals, wherein the output signals produced by some of the blocks are supplied as the input signals to others of the blocks;

b. performing a first simulation of behavior of the circuit described by the first circuit model during successive first simulation cycles, the first simulation producing dump file data indicating states of block input and output signals between successive first simulation cycles;

c. modifying the first circuit model to change its description of at least one of the circuit blocks while descriptions of others of the blocks remain unchanged, thereby to produce a second circuit model;

d. processing the first and second circuit models to classify each block of the second circuit model having a changed description as a variant block, to classify each block having an unchanged description that is within a fan-out cone of a variant block as a conditional block, and to classify each other unchanged block as an invariant block; and e. performing a second simulation of the behavior of the circuit described by the fist circuit model in response to the input signal during each of a plurality of successive second simulation cycles, wherein a separate decision made relative to each conditional block immediately preceding each second simulation cycle determines whether a state of each output signal of the conditional block at the end of the second simulation cycle is thereafter determined from dump file data produced by the first simulation or determined by simulating the behavior of the conditional block during the second simulation cycle.

2. The method in accordance with claim 1 wherein the second simulation determines states of output signals of the variant blocks at an end of each second simulation cycle by simulating behavior of the variant blocks during'that second simulation cycle, and wherein the second simulation determines states of output signals of invariant blocks at the end of each second simulation cycle from the dump file data produced by the first simulation.

3. The method in accordance with claim 1 wherein the separate decision made relative to each conditional block immediately preceding each second simulation cycle is based on a comparison of data produced during the second simulation and the dump file data produced by the first simulation.

4. The method in accordance with claim 1 wherein each second simulation cycle corresponds to a separate one of the first simulation cycles, and wherein the separate decision made relative to each conditional block immediately preceding each second simulation cycle comprises comparing a determined state of each input signal to the conditional block at an end of a preceding second simulation cycle to a determined state of each input signal to the conditional block at an end of a corresponding first simulation cycle as indicated by the dump file data produced by the first simulation.

5. The method in accordance with claim 4 wherein when the determined state of each input signal to the conditional block at the end of the preceding second simulation cycle fails to match the determined state of each input signal to the conditional block at the end of the corresponding first simulation cycle, the second simulation determines the state of each output signal of the conditional block at the end of the second simulation cycle by simulating the behavior of the conditional block during the second simulation cycle, and wherein when the determined state of each input signal to the conditional block at the end of a preceding second simulation cycle matches the determined state of each input signal to the conditional block at the end of the corresponding first simulation cycle, the second simulation determines the state of each output signal of the conditional block at the end of the second simulation cycle from the dump file data produced by the first simulation indicating a state of each output signal of the conditional block at the end of a first simulation cycle corresponding to the second simulation cycle.

6. The method in accordance with claim 5 wherein the second simulation determines states of output signals of the variant blocks at an end of each second simulation cycle by simulating behavior of the variant blocks during that second simulation cycle, and wherein the second simulation determines states of output signals of invariant blocks at the end of each second simulation cycle from the dump file data produced by the first simulation.

* * * * *